(12) United States Patent
Hur et al.

(10) Patent No.: US 7,665,947 B2
(45) Date of Patent: Feb. 23, 2010

(54) TRANSFER CHAMBER FOR FLAT DISPLAY DEVICE MANUFACTURING APPARATUS

(75) Inventors: Gwang Ho Hur, Yongin-shi (KR); Jun Young Choi, Seoul (KR); Sang Baek Lee, Suwon-shi (KR); Cheol Won Lee, Anyang-shi (KR)

(73) Assignee: Advanced Display Process Engineering Co., Ltd., Kyunggi-do (KR)

( * ) Notice: Subject to any disclaimer, the term of this patent is extended or adjusted under 35 U.S.C. 154(b) by 14 days.

(21) Appl. No.: 12/129,010

(22) Filed: May 29, 2008

(65) Prior Publication Data
US 2008/0292431 A1 Nov. 27, 2008

Related U.S. Application Data

(62) Division of application No. 10/978,967, filed on Nov. 1, 2004.

(30) Foreign Application Priority Data

| Nov. 4, 2003 | (KR) | .......................... 10-2003-77631 |
| Nov. 4, 2003 | (KR) | .......................... 10-2003-77633 |
| Nov. 14, 2003 | (KR) | .......................... 10-2003-80413 |

(51) Int. Cl.
*H01L 21/677* (2006.01)
(52) U.S. Cl. .................................................. 414/217
(58) Field of Classification Search ................ 414/217, 414/217.1, 935, 225.01, 941
See application file for complete search history.

(56) References Cited

U.S. PATENT DOCUMENTS

| 2,566,777 | A | | 9/1951 | Schmidt |
| 4,880,349 | A | * | 11/1989 | Woodward .................... 29/743 |
| 5,140,242 | A | * | 8/1992 | Doran et al. ................. 318/640 |
| 5,194,743 | A | * | 3/1993 | Aoyama et al. ............. 250/548 |
| 5,314,574 | A | | 5/1994 | Takahashi |
| 5,433,835 | A | | 7/1995 | Demaray et al. |
| 5,836,575 | A | | 11/1998 | Robinson et al. |
| 5,853,176 | A | | 12/1998 | Kiriyama |
| 5,934,856 | A | | 8/1999 | Asakawa et al. |
| 5,969,441 | A | * | 10/1999 | Loopstra et al. .......... 310/12.06 |
| 5,989,346 | A | | 11/1999 | Hiroki |
| 6,045,315 | A | | 4/2000 | Azumano et al. |
| 6,048,154 | A | | 4/2000 | Wytman |
| 6,103,055 | A | | 8/2000 | Maher et al. |
| 6,117,238 | A | | 9/2000 | Begin |
| 6,155,768 | A | | 12/2000 | Bacchi et al. |
| 6,231,297 | B1 | | 5/2001 | Hofmeister |
| 6,315,512 | B1 | | 11/2001 | Tabrizi et al. |
| 6,327,034 | B1 | * | 12/2001 | Hoover et al. ............... 356/400 |
| 6,509,564 | B1 | * | 1/2003 | Suzuki et al. ............... 250/310 |
| 6,537,415 | B2 | | 3/2003 | Kojima et al. |

(Continued)

*Primary Examiner*—Charles A Fox
(74) *Attorney, Agent, or Firm*—KED & Associates, LLP

(57) ABSTRACT

A transfer chamber for a flat display device manufacturing apparatus is provided. The transfer chamber may provide a combination of the functions of a transfer and a load-lock chamber. A robot may be provided aside from a center of the transfer chamber, a buffer may be provided and be driven without interference with the robot, and an aligner may be provided to adjust a position of a substrate mounted on the buffer. A sealing member may be provided to seal a hole formed at a predetermined portion of the transfer chamber.

17 Claims, 15 Drawing Sheets

U.S. PATENT DOCUMENTS

| | | |
|---|---|---|
| 6,551,045 B2 | 4/2003 | Binnard et al. |
| 6,746,196 B1 | 6/2004 | Ozawa et al. |
| 7,104,535 B2 * | 9/2006 | Kurita et al. ............... 269/303 |
| 7,374,386 B2 * | 5/2008 | Talmer ...................... 414/217 |
| 2002/0048506 A1 | 4/2002 | Babbs et al. |
| 2003/0012624 A1 * | 1/2003 | Kinnard et al. ............. 414/217 |
| 2003/0021658 A1 | 1/2003 | Blonigan |
| 2004/0018070 A1 | 1/2004 | Zhao et al. |
| 2004/0046294 A1 * | 3/2004 | Kubo et al. ................. 267/136 |
| 2005/0183824 A1 | 8/2005 | Lee et al. |

* cited by examiner

TRANSFER CHAMBER FOR FLAT DISPLAY DEVICE MANUFACTURING APPARATUS

CROSS REFERENCE TO RELATED APPLICATION

This application is a divisional of and claims the benefit of pending U.S. patent application Ser. No. 10/978,967, entitled Transfer Chamber For Flat Display Device Manufacturing Apparatus, filed on Nov. 1, 2004, which claims priority under The Paris Convention for the Protection of Industrial Property to Korean Application No. 2003-77631 filed on Nov. 4, 2003, Korean Application No. 2003-77633 filed on Nov. 4, 2003, and Korean Application No. 2003-80413 filed on Nov. 14, 2003, all of which are hereby incorporated by reference.

BACKGROUND OF THE INVENTION

1. Field of the Invention

The present invention relates to a transfer chamber for a flat display device manufacturing apparatus, and more particularly, to a transfer chamber for a flat display device manufacturing apparatus, having a combination of functions of transfer and load-lock chambers, in which a robot is provided aside from a center of the transfer chamber, a buffer is provided to be driven without interference of the robot, and an aligner is provided to adjust a position of a substance mounted on the buffer.

2. Description of Related Art

In general, a three-chamber type flat display device manufacturing apparatus has been used. The three-chamber type flat display device manufacturing apparatus has tree chambers: a load-lock chamber, a transfer chamber, and a process chamber. As the size of a substrate increases, there is a problem in that the size of the chambers proportionally increase. Since increase in the size of chamber has a limitation, a two-chamber type flat display device manufacturing apparatus has recently been proposed. In the two-chamber flat display device manufacturing apparatus, the load-lock and transfer chambers are combined as a single transfer chamber. Therefore, the two-chamber type flat display device manufacturing apparatus has transfer and process chambers. As a result, the volume of the flat display device manufacturing apparatus can be reduced. Accordingly, a volume of a clean room where the flat display device manufacturing apparatus is installed can be reduced.

Like the transfer chamber of the three-chamber flat display device manufacturing apparatus, in the transfer chamber of the two-chamber flat display device manufacturing apparatus, a robot is provided. The robot has a function of carrying-in a to-be-processed substrate into the process chamber and carrying-out a processed substrate from the process chamber.

As shown in FIGS. 1 and 2, in a transfer chamber 200, a robot 300 is installed. The robot 300 includes a robot arm 320 having a joint member 310 at a predetermined portion thereof and a robot hand 330 connected to one end portion of the robot arm 320. The robot arm 320 rotates around a robot shaft 340 transfer a substrate mounted on the robot hand 330 to a process chamber 100. Therefore, the transfer chamber 200 needs to have at least a volume for ensuring a rotational radius of the robot arm 320.

On the other hand, in case of using the two-chamber flat display device manufacturing apparatus, the process time depends on pumping and venting time periods in vacuumizing and atmospherically-pressurizing processes. More specifically, after a to-be-processed substrate is inserted into a process chamber 100 and the processes are completed, the transfer chamber 200 must be maintained in an atmospheric ambience in order to take out the processed substrate from the transfer chamber 200. In addition, after the processed substrate is taken out from the transfer chamber 200, a new to-be-processed substrate is inserted into the process chamber 100, and then, the transfer chamber 200 must be maintained in a vacuum ambience. The process time for the vacuumizing and atmospherically-pressurizing processes increases in proportion to the internal volume of the transfer chamber 200.

Therefore, there has been much demand for reducing the internal volume of the transfer chamber in the two-chamber flat display device manufacturing apparatus.

On the other hand, in the three-chamber flat display device manufacturing apparatus, there is provided a buffer for loading the substrate into the load-lock chamber. Therefore, after the to-be-processed substrate is mounted on the buffer in advance, and then, a robot installed in the transfer chamber takes the to-be-processed substrate mounted on the buffer into the process chamber. In addition, the robot takes out the processed substrate from the process chamber and loads the processed substrate on the buffer.

However, since there is not a separate load-lock chamber in the two-chamber flat display device manufacturing apparatus, there is a problem in that it is impossible to provide the buffer to the load-lock chamber.

As a result, the buffer must be provided to the transfer chamber. However, there are several problems in providing the buffer the transfer chamber in that the buffer must not interfere with the rotation of the robot 300 installed in the transfer chamber 200.

In addition, in the conventional load-lock chamber, an aligner is provided to adjust the positions of the buffer and the substrate mounted on the buffer. Therefore, the position of the substrate can be accurately adjusted and the robot installed in the transfer chamber can transfer the accurately-adjusted substrate into the process chamber.

Recently, as the size of the processed substrate has been enlarged, the flat display device manufacturing apparatus occupies a large volume in a clean room. Therefore, there has been a demand for implementing the two-chamber flat display device manufacturing apparatus by integrating the load-lock and transfer chambers into a single chamber in order to reduce the volume of the flat display device manufacturing apparatus.

In addition, there is a problem in that the aforementioned aligner used for the load-lock chamber in the three-chamber flat display device manufacturing apparatus cannot be used for the transfer chamber in the two-chamber flat display device manufacturing apparatus. On the other hand, the position of the substrate has been adjusted by moving the opposite corners of the substrate in diagonal directions with a conventional aligner. However, as the size of the processed substrate has been enlarged, there has been another problem in that the conventional adjusting method of the aligner may cause damage to the enlarged substrate.

Therefore, there is a demand for developing an aligner suitable for the two-chamber flat display device manufacturing apparatus.

SUMMARY OF INVENTION

In order to solve the aforementioned problems, an object of the present invention is to provide a flat display device manufacturing apparatus capable of reducing an interval volume of a transfer chamber by changing an installation position of a robot in the transfer chamber.

Another object of the present invention is to provide a flat display device manufacturing apparatus having a buffer not interfering with the movement of the robot.

Still another object of the present invention is to provide a substrate-position adjusting member suitable for a two-chamber flat display device manufacturing apparatus.

Further still another object of the present invention is to provide a substrate-position adjusting member capable of easily adjusting a position of an enlarged substrate.

Further still another object of the present invention is to provide a transfer chamber flat display device manufacturing apparatus where an easily exchangeable sealing-member attaching part.

In order to achieve the aforementioned objects, according to an aspect of the present invention, there is provided a transfer chamber for a flat display device manufacturing apparatus, wherein a robot is provided aside from a center of the transfer chamber.

In addition, the transfer chamber for a flat display device manufacturing apparatus may further comprise a buffer comprising: a buffer plate having a plurality of buffer fingers; a first driving unit for supporting and driving some of the buffer fingers; a second driving unit for supporting and driving others of the buffer fingers; a power source unit for supplying power used to drive the first and second driving units; and a power transmission device for connecting the power source unit to the first and second driving units to transmit the power supplied from the power source unit to the first and second driving units.

In addition, a robot shaft through-hole which the robot shaft passes through may be provided at a predetermined lower portion of the transfer chamber, wherein a flange having a predetermined shape is provided at the upper portion of the robot shaft, and wherein a sealing-member attaching part where sealing-member attaching positions are provided is fastened at the robot shaft through-hole by using the fastening means.

In addition, the transfer chamber may comprise first substrate-position adjusting members for adjusting the x-directional movement of a substrate and second substrate-position adjusting members for adjusting the y-directional movement of the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
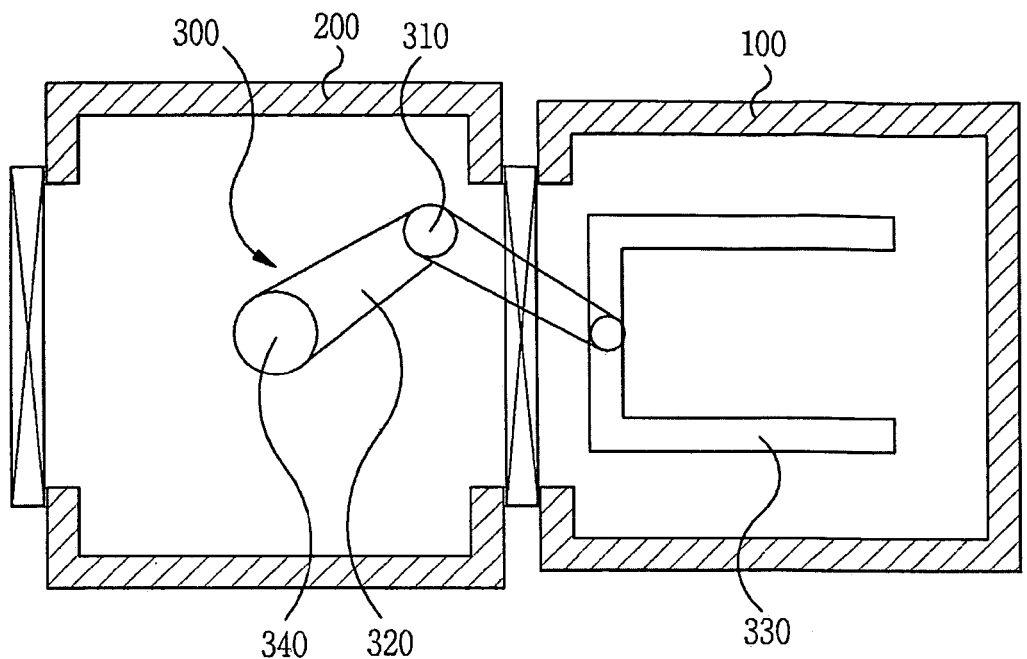
FIG. 1 is a cross sectional view of transfer and process chambers for a conventional flat display device manufacturing apparatus in case of putting a robot hand of a robot installed in the transfer chamber into the process chamber.
Figure 2:
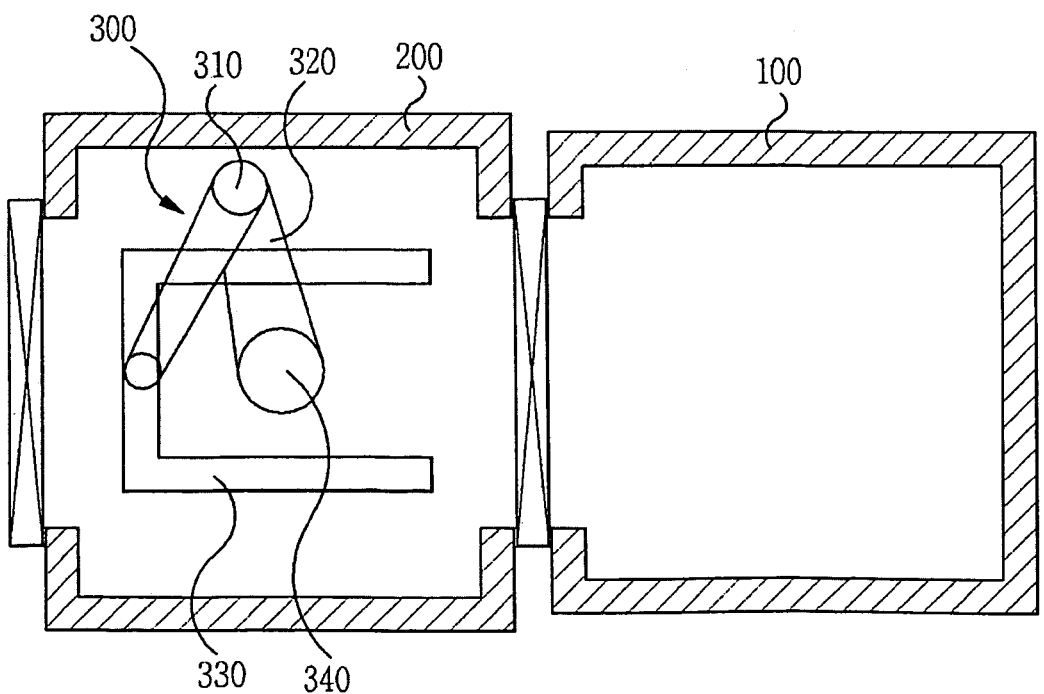
FIG. 2 is a cross sectional view of the transfer and process chambers for the conventional flat display device manufacturing apparatus in case of taking out the robot hand of the robot installed in the transfer chamber from the process chamber.

The present invention and operational advantages thereof can be fully understood by referring to the accompanying drawings and explanations thereof.

Now, exemplary embodiments of the present invention will be described with reference to the accompanying drawings to explain the present invention in detail. In the drawings, the same reference numerals indicate the same elements.

In order to achieve the aforementioned objects, according to an aspect of the present invention, there is provided a transfer chamber for a flat display device manufacturing apparatus, wherein a robot is provided aside from a center of the transfer chamber.

In addition, the transfer chamber for a flat display device manufacturing apparatus may further comprise a buffer comprising: a buffer plate having a plurality of buffer fingers; a first driving unit for supporting and driving some of the buffer fingers; a second driving unit for supporting and driving others of the buffer fingers; a power source unit for supplying power used to drive the first and second driving units; and a power transmission device for connecting the power source unit to the first and second driving units to transmit the power supplied from the power source unit to the first and second driving units.

Now, preferred embodiments of the present invention will be described with reference to the accompanying drawings.

Firstly, in a transfer chamber 200 according to the present invention, a robot 300 comprising a robot shaft 340, a robot arm 320, and a robot hand 330 is provided aside from a center of the transfer chamber 200.

Figure 3:
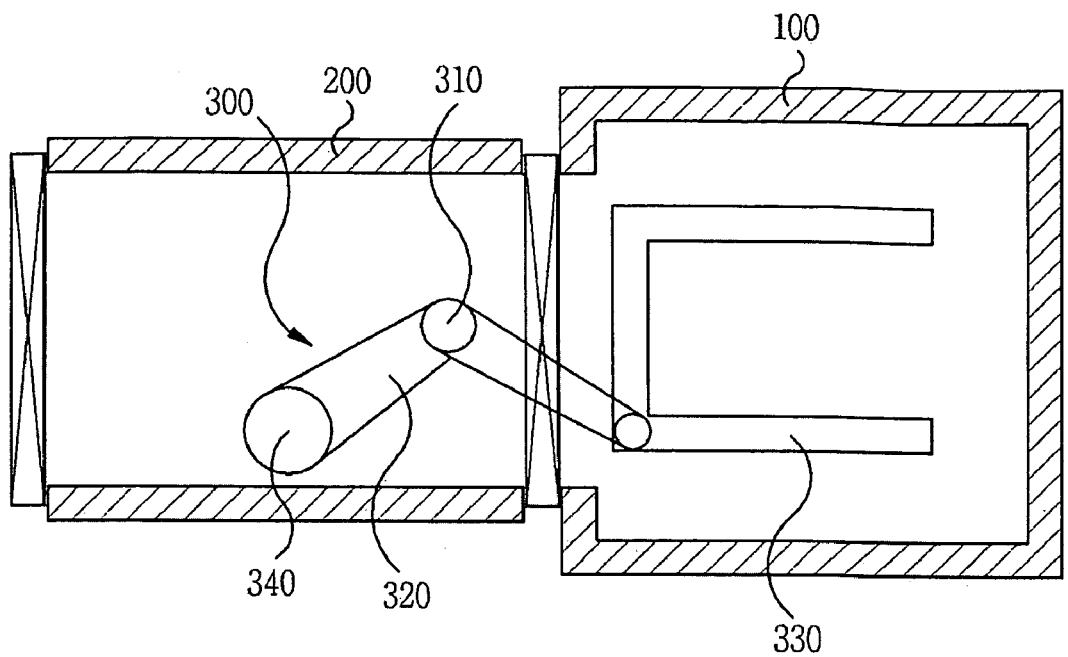
FIG. 3 is a cross sectional view of transfer and process chambers for a flat display device manufacturing apparatus according to the present invention in case of putting a robot hand of a robot installed in the transfer chamber into the process chamber.
Figure 4:
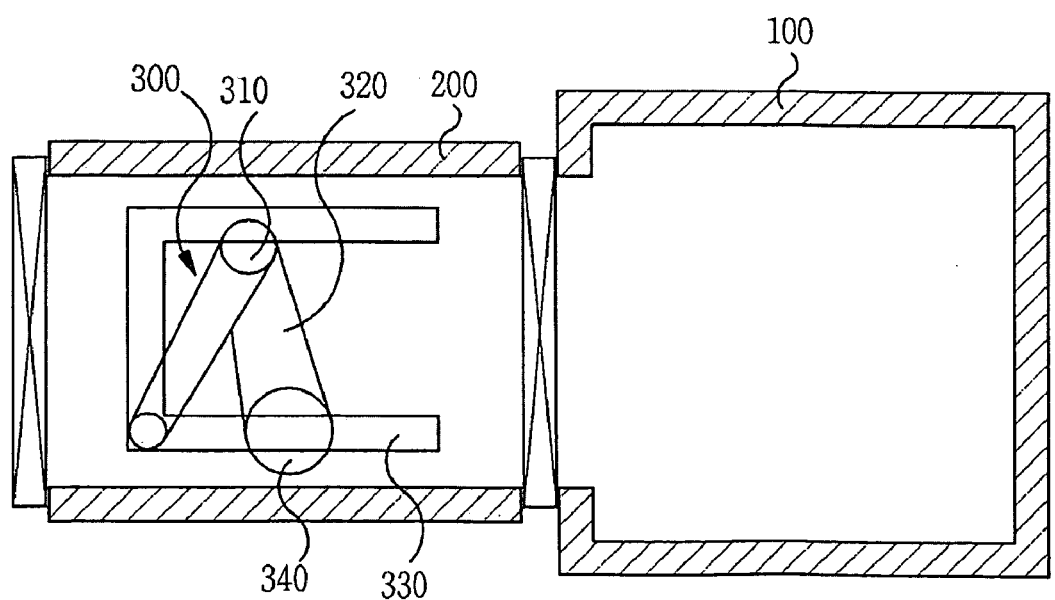
FIG. 4 is a cross sectional view of the transfer and process chambers for the flat display device manufacturing apparatus according to the present invention in case of taking out the robot hand of the robot installed in the transfer chamber from the process chamber.

As shown in FIG. 3, the robot shaft 340 connected to a driving device (not shown) installed outside of the transfer chamber 200 is provided aside from the center of the chamber 200 unlike a conventional chamber 200 of FIG. 1 in which the robot shaft 340 is provided at the center of the chamber 200. In addition, the robot arm 320 is connected not to a central portion of the robot hand 330 but to an end portion of the robot hand 330.

In the conventional transfer chamber 200 shown in FIG. 1, since the robot shaft 340 is provided at the center of the transfer chamber 200, the volume of the transfer chamber 200 is increased in order to ensure a rotational radius of the robot arm 320. However, in the transfer chamber 200 according to the transfer chamber 200 shown in FIG. 3, since the robot shaft 340 is provided aside from the center of the chamber 200, the volume of the transfer chamber 200 can be relatively decreased while the rotational radius of the robot arm 320 is ensured.

Since the volume of the transfer chamber 200 is decreased, pumping and venting time periods in a vacuumizing or atmospherically-pressurizing process can be relatively reduced, so that it is possible to improve a rate of operation of equipment.

In addition, in the transfer chamber 200 of the flat display device manufacturing apparatus according to the present invention, a buffer 400 is provided. The buffer 400 comprises a buffer plate 410, a first driving member 420, a second driving member 430, a power source unit 440, and a power transmission device 450.

Figure 6:
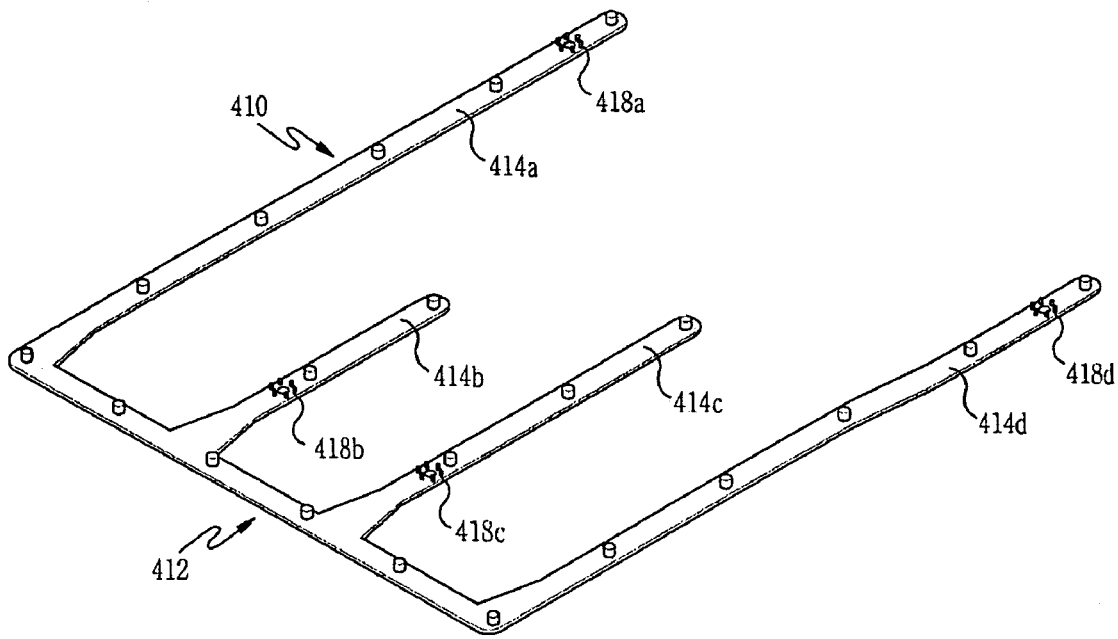
FIG. 6 is a perspective view of a structure of a buffer plate according to the present invention.

As shown in FIG. 6, the buffer plate 410 comprises a plurality of buffer fingers. More specifically, the buffer plate 410 has a long buffer-finger connecting bar 412. Preferably, four buffer fingers 414a, 414b, 414c, and 414d are perpendicularly connected to the buffer-finger connecting bar 412 at the end portions and predetermined intermediate portions thereof. Preferably, the buffer fingers 414a, 414b, 414c, and 414d and the buffer-finger connecting bar 412 constitute a plate structure. As shown in FIG. 6, the lengths of the buffer fingers 414a, 414b, 414c, and 414d are so different that the buffer plate 410 can move vertically without interference of the robot 300 in the transfer chamber 200. The first and fourth buffer fingers 414a and 414d connected to the end portions of the buffer-finger connecting bar 412 are long. The second and third buffer fingers 414b and 414c are so short that the robot arm cannot be overlapped. Therefore, the lengths of second and third buffer fingers 414b and 414c are shorter than the first or fourth buffer fingers 414a or 414d by predetermined distances.

In addition, as shown in FIG. 6, a plurality of buffer pins 416 are provided in a predetermined interval on each of the buffer fingers 414a, 414b, 414c, and 414d and the buffer-finger connecting bar 412. The buffer pins 416 are in contact with a substrate to support the substrate when the substrate is mounted on the buffer 400 in the transfer chamber 200.

In addition, as shown in FIG. 6, each of the buffer fingers 414a, 414b, 414c, and 414d has a bellows engaging hole 418a, 418b, 418c or 418d for engaging the bellows modules with the respective buffer fingers.

Figure 5:
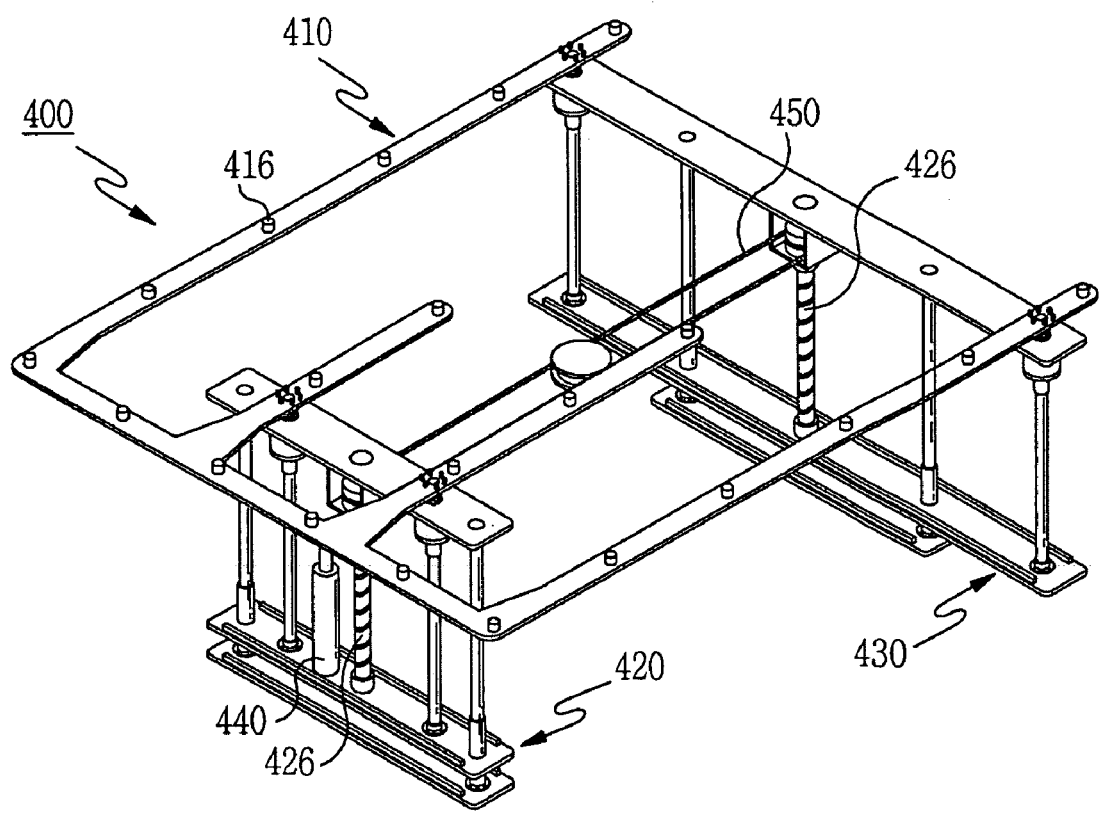
FIG. 5 is a perspective view of a buffer installed in the transfer chamber for the flat display device manufacturing apparatus according to the present invention.

As shown in FIG. 5, two driving units of the first and second driving units 420 and 430 are provided at the front and rear sides of the buffer 400. The detailed components of the first and second driving units 420 and 430 are the same. But, the installation positions of the detailed components of the first and second driving units 420 and 430 are different because different buffer fingers are connected to the different driving units. For convenience of description, only the components of the first driving unit 420 will be described, and for the components of the second driving unit 430 only the installation positions thereof will be described.

The first driving unit 420 is connected to the second and third buffer fingers 414b and 414c to support the second and third buffer fingers 414b and 414c. The first driving unit 420 vertically moves the second and third buffer fingers 414b and 414c by using the power transmitted from the power source unit 440. In other words, as shown in FIG. 5, the first driving unit 420 is connected to the second and third buffer fingers 414b and 414c, that is, short buffer fingers connected to the intermediated portions of the buffer-finger connecting bar 412. The second driving unit 430 is connected to the first and fourth buffer fingers 414a and 414d, that is, long buffer fingers connected to the end portions of the buffer-finger connecting bar 412.

Figure 7:
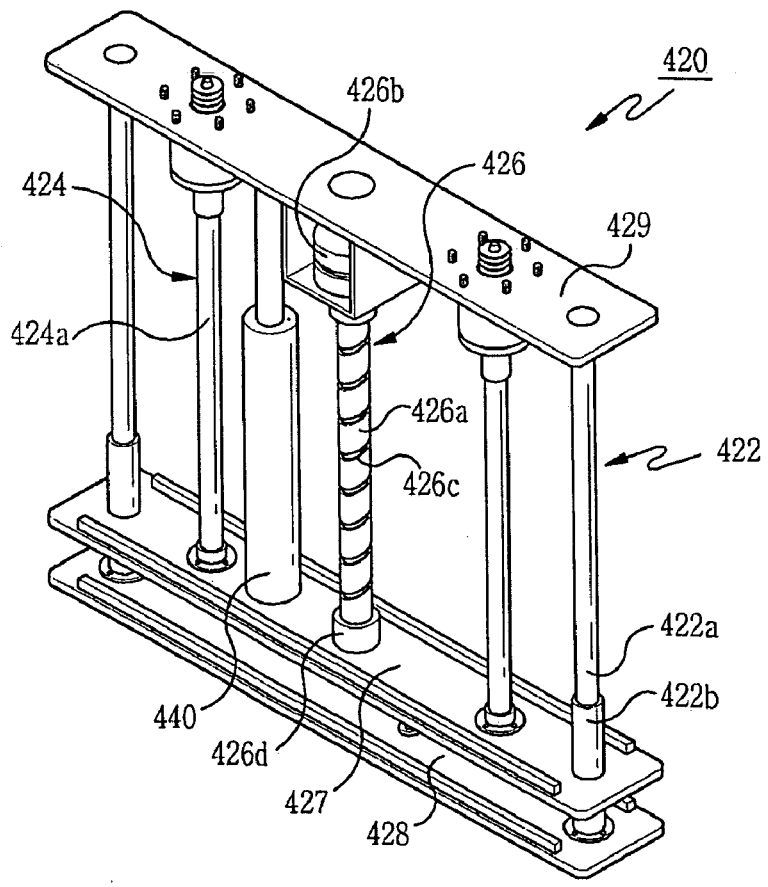
FIG. 7 is a perspective view of a structure of a first driving unit according to the present invention.

As shown in FIG. 7, the first driving unit 420 comprises two interlocking guides 422, two bellows modules 424 and a driving shaft 426.

The two interlocking guides 422 are provided at predetermined positions of the first driving unit 420. Each of the interlocking guides 422 comprises a long cylindrical guide rail 422a and a guide cylinder 422b vertically moving with surrounding the guide rail 422a. The guide rail 422a of each of the interlocking guides 422 is fixed and the guide cylinder 422b thereof vertically moves, so that the bellows modules 424 and the driving shaft 426 can accurately be guided to vertically move.

In addition, the driving shaft 426 comprises a power-transmission-device connecting member 426b at a predetermined portion thereof and a first driving member at another predetermined portion thereof. The driving shaft 426 comprises a long cylindrical driving shaft column 426a. At the upper portion of the driving shaft column 426a, power-transmission-device connecting member 426b connected to the power transmission device 450 is provided. At the lower portion of the power-transmission-device connecting member 426b, a first driving member 426c is provided. The first driving member 426c has a helical thread on a surface thereof so that a second driving member 426d can vertically move with rotation of the driving shaft column 426a. In addition, the second driving member 426d is a cylinder having a corresponding helical thread on an internal surface thereof to vertically move with surrounding the first driving member 426c. Therefore, when the first driving member 426c rotates, the second driving member 426d surrounding the first driving member 426c can vertically move since the second driving member 426*c* has the corresponding helical thread.

Figure 9:
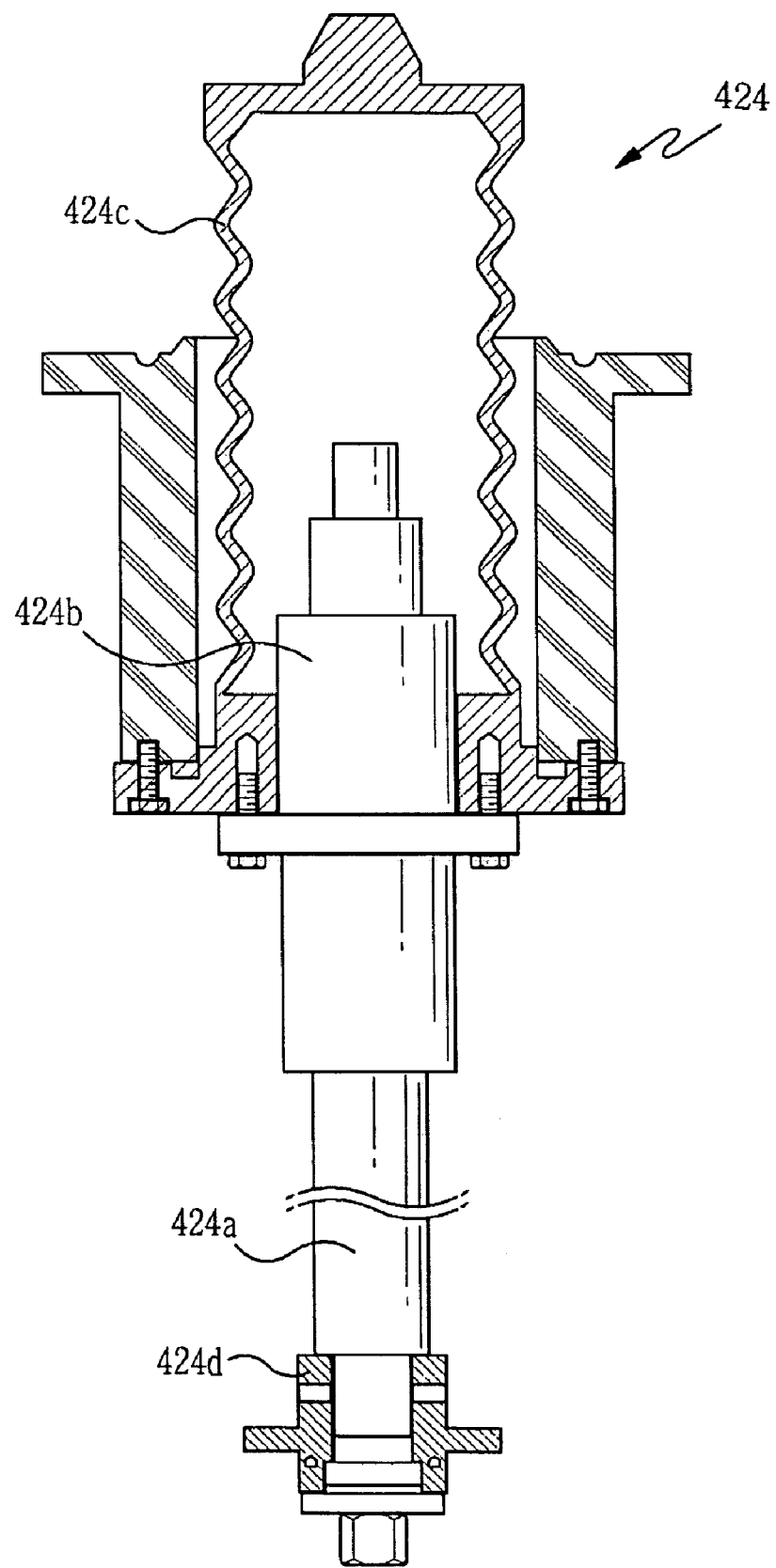
FIG. 9 is a cross sectional view of a structure of a bellows module according to the present invention.

In addition, the two bellows modules 424 are provided at predetermined portions of the first driving unit 420. The upper ends of the two bellows modules 424 are engaged with the second and third buffer fingers 414*b* and 414*c*. As shown in FIG. 9, each of the bellows modules 424 comprises a long cylindrical shaft 424*a*, a cylindrical linear bushing 424*b* connected to the upper portion of the cylindrical shaft 424*a*, bellows 424*c* connected to the linear bushing 424*b* and expansible in a longitudinal direction, and a buffer-plate balance adjusting device 424*d* connected to the lower portion of the cylindrical shaft 424*a*.

Now, functions of the bellows module 424 will be described with reference to FIG. 9. The cylindrical shaft 424*a* passing through the linear bushing 424*b* vertically moves. The upper portion of the cylindrical shaft 424*a* is shaped similarly to the upper portions of the upper portion of the bellows 424*c*, so that the cylindrical shaft 424*a* can vertically move within the bellows 424*c*. The bellows 424*c* isolates the internal portion of the bellows 424*c* from the external portion of the bellows 424*c*, so that the cylindrical shaft 424*a* can vertically move while the internal and external portions of the bellows 424*c* are maintained in atmospheric and vacuum ambiences, respectively. In addition, the linear bushing 424*b* has a function of accurately adjusting the vertical movement of the cylindrical shaft 424*a*. In addition, a bolt is connected to the lower portion of the buffer-plate balance adjusting device 424*d*, so that the height of the buffer plate 410 connected to the bellows module 424 can be controlled by screwing the bolt with a tool such as a spanner.

As shown in FIG. 7, in the first driving unit 420, an interlocking plate 427 is provided. The lower portion of the bellows modules 424 are fixed connected to the interlocking plate 427. The second driving member 426*d* of the driving shaft 426 is fixed connected to the interlocking plate 427 and the driving shaft 426 and the interlocking guides 422 are connected to pass through the interlocking plate 427, so that the interlocking plate 427 can be interlocked with the diving of the driving shaft 426. Namely, the interlocking plate 427 vertically moves according to the interlocked movement of the buffer plate 410 via the driving shaft 426, so that the detailed components of the first and second driving units 420 and 430 can accurately move.

In addition, as shown in FIG. 7, in the first driving unit 420, a lower plate 428 is provided. The lower plate 428 is connected to the lower portions of the interlocking guides 422 and driving shaft 426 to fix the first driving unit 420 to the transfer chamber 200. The lower plate 428 has a function of supporting the detailed components of the first driving unit 420 so that the detailed components can accurately vertically move.

In addition, as shown in FIG. 7, in the first driving unit 420, an upper plate 429 is provided. The upper plate 429 is connected to the upper portions of the interlocking guides 422 and driving shaft 426. The bellows modules 424 are connected to pass through the upper plate 429 at predetermined portions thereof. The upper plate 429 is provided to extend from the internal portion to the external portion of the transfer chamber 200. The upper plate 429 has a function of connecting the first driving unit 420 to the transfer chamber 200. The upper and lower surfaces of the upper plate 429 are located in the internal and external portions of the transfer chamber 200, respectively.

Figure 8:
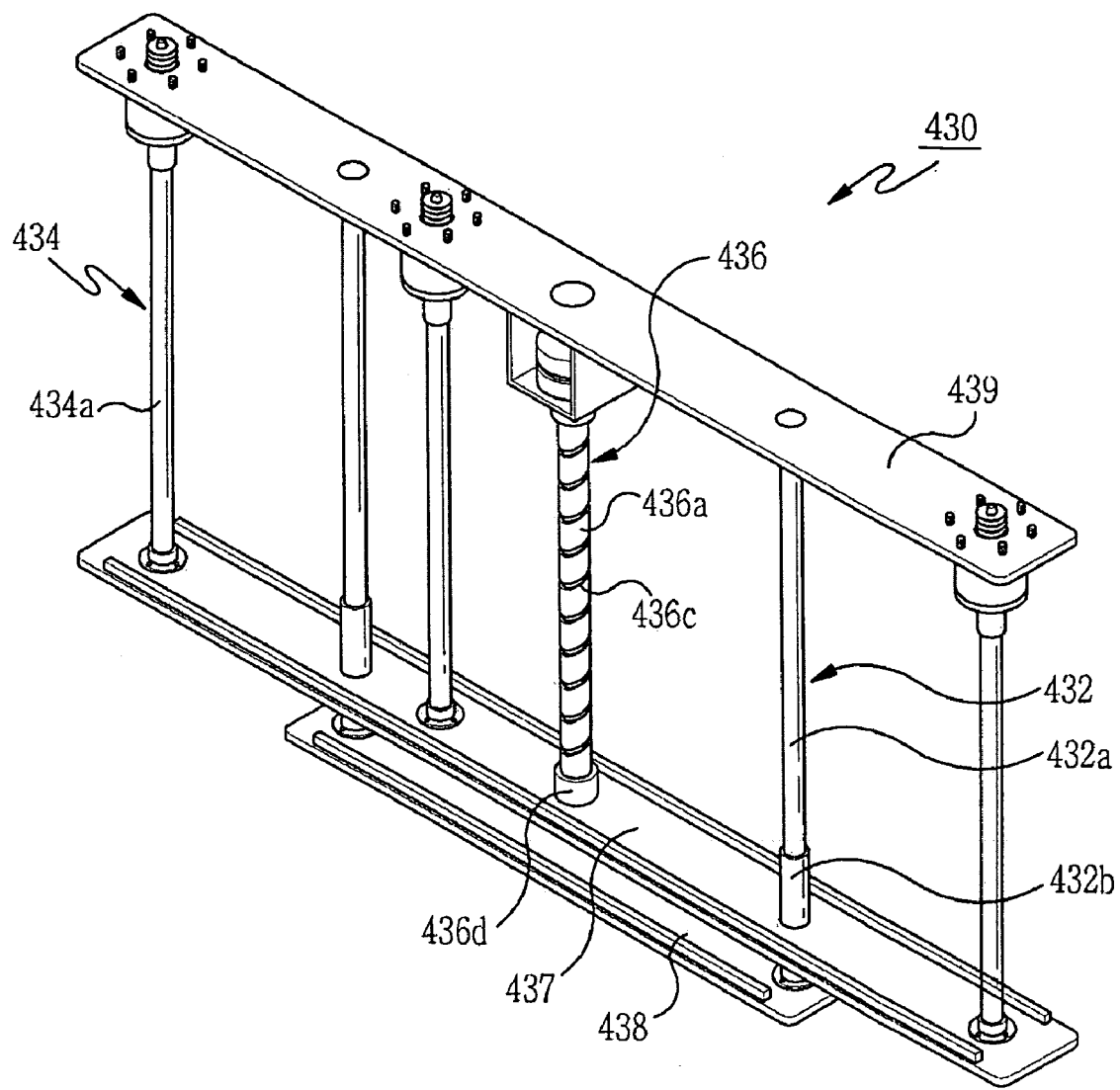
FIG. 8 is a perspective view of a structure of a second driving unit according to the present invention.

The detailed components of the second driving unit 430 are the same as the first driving unit 420. However, as shown in FIG. 8, since the second driving unit 430 supports the first and fourth buffer fingers 414*a* and 414*d*, two bellows modules 434 including a cylindrical shaft 434*a* are provided at the end portions of the second driving unit 430, and two interlocking guides 432 including a guide rail 432*a* and a guide cylinder 432*b* are provided at the intermediate portions of the second driving unit 430. The second driving unit 430 also includes a driving shaft 436 including a column 436*a* and first and second driving members 436*c* and 436*d*, an interlocking plate 437, and a lower plate 438.

As shown in FIG. 7, the buffer 400 comprises the power source unit 440. The power source unit 440 supplies power to the first and second driving units 420. In the embodiment, the power source unit 440 is provided to a predetermined portion of the interlocking plate 427 of the first driving unit 420. The power transmission device 450 transmits the power supplied from the power source unit 440 to the first and second driving units 420 and 430, so that the buffer 400 can be driven. Preferably, the power source unit 440 is a motor.

In addition, as shown in FIG. 5, in the buffer 400, the power transmission device 450 connects the power source unit 440 with the driving shaft 426 to transmit the power supplied from the power source unit 440 to the driving shaft 426. Since the first and second driving units 420 and 430 are connected to each other via the power transmission device 450, the buffer plate can vertically move by simultaneously vertically moving the first and second driving units 420 and 430.

Figure 10:
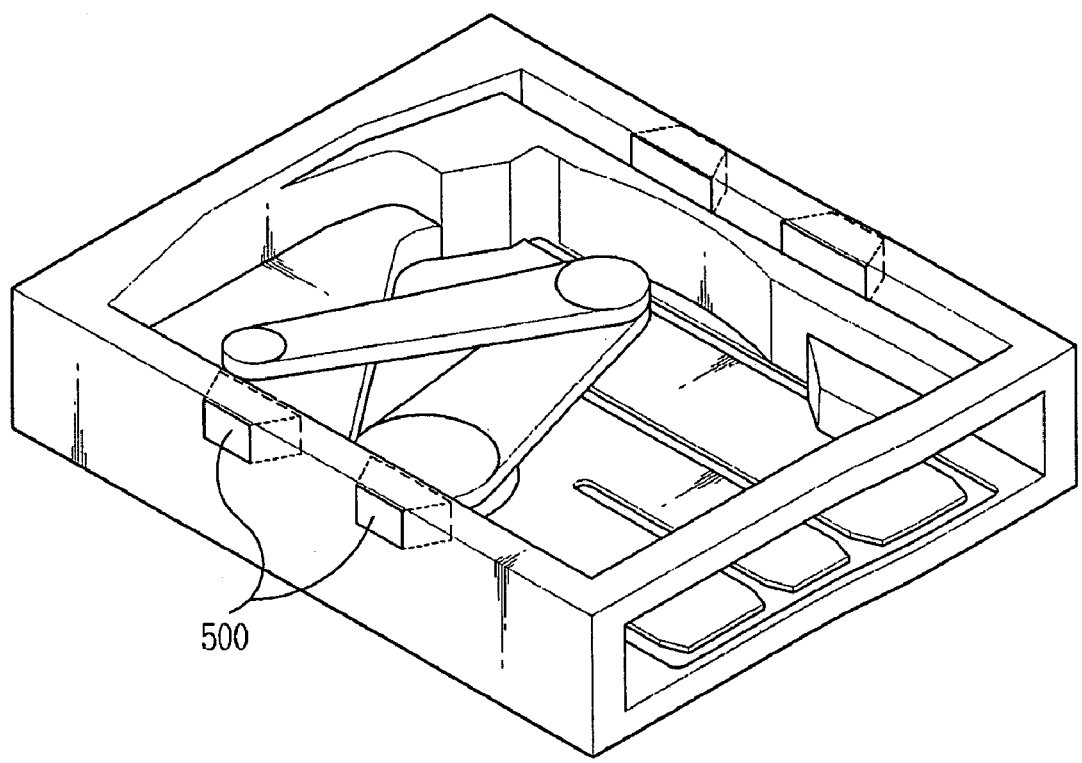
FIG. 10 is a perspective view of the robot and buffer installed in the transfer chamber for the flat display device manufacturing apparatus according to the present invention.

As shown in FIG. 10, in the transfer chamber 200, a plurality of view ports 500 are provided at predetermined portions of sides of the transfer chamber 200, so that the internal portion of the transfer chamber 200 can be observed. Each of the view ports 500 has a narrow outer window and a wide inner window, so that the internal portions of the transfer chamber 200 can be more widely observed.

Now, a sealing unit installed at the robot installation position in the transfer chamber of the flat display device manufacturing apparatus according to the present invention will be described.

A robot shaft through-hole which the robot shaft passes through is provided at a predetermined lower portion of the transfer chamber. A flange having a predetermined shape is provided at the upper portion of the robot shaft. In addition, a sealing-member attaching part where sealing-member attaching positions are provided is fastened at the robot shaft through-hole by using the fastening means.

In addition, the flange is a circular or polygonal member protruded from the outer surface of the upper portion of the robot shaft. In addition, the diameter of the flange is larger than that of the robot shaft through-hole, and the diameter of the robot shaft is smaller than that of the robot shaft through-hole.

In addition, a through-hole which the robot shaft 510 can pass though is provided at a center of the sealing-member attaching part, and the sealing-member attaching part comprises an upper cylindrical portion having a small diameter and a lower cylindrical portion having a large diameter.

Preferably, the fastening means is a bolt.

Preferably, the sealing members are O-rings. The sealing-member attaching positions are provided on the upper and lower cylinder portions of the sealing-member attaching parts.

Figure 11:
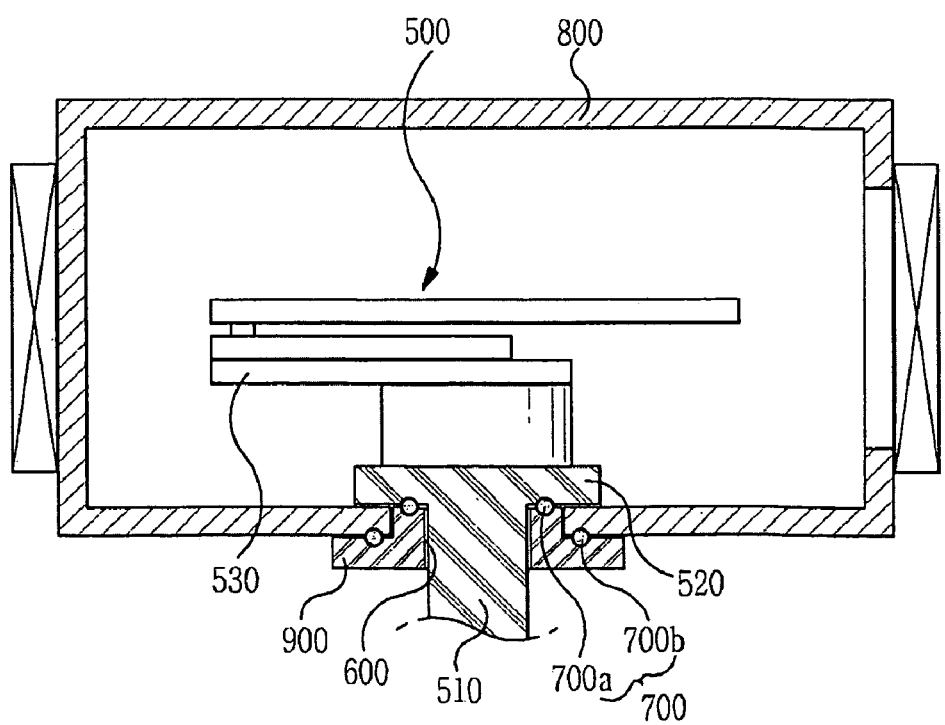
FIG. 11 is a vertical cross sectional view of the transfer chamber according to the present invention where sealing members are provided.

Firstly, as shown in FIG. 11, in the transfer chamber 800 of the flat display device manufacturing apparatus according to the present invention, a robot shaft through-hole 600, a robot 500, and a sealing-member attaching part 900 are provided. The robot shaft through-hole 600 is a hole which a robot shaft 510 of the robot 500 passes through. After the robot shaft 510 is installed to pass through the robot shaft through-hole 600, the sealing-member attaching part 900 is fastened between the robot shaft 510 and the robot shaft through-hole 600 in order to isolate the internal portion of the transfer chamber 800 from the external portion thereof.

The robot shaft through-hole 600 is provided to a predetermined lower portion of the transfer chamber 800. Preferably, the robot shaft through-hole 600 has a circular cross section having a diameter enough for the robot shaft 510 to pass through.

As shown in FIG. 11, the robot 500 comprises the robot shaft 510, a robot arm 530, a flange 520 and a driving device (not shown). The robot shaft 510 supports the robot arm 530 and connects the robot 500 with the driving device (not shown). In addition, the robot arm 530 is connected to the upper portion of the robot shaft 510. The robot arm 530 has a joint member to rotate. In addition, the flange 520 is a circular or polygonal member protruded from the outer surface of the upper portion of the robot shaft 510. The flange 520 is closely attached on the bottom of the transfer chamber 800 when the robot 500 is installed in the transfer chamber 800.

Preferably, the diameter of the flange 520 is larger than that of the robot shaft through-hole 600, and the diameter of the robot shaft 510 is smaller than that of the robot shaft through-hole 600.

Figure 12:
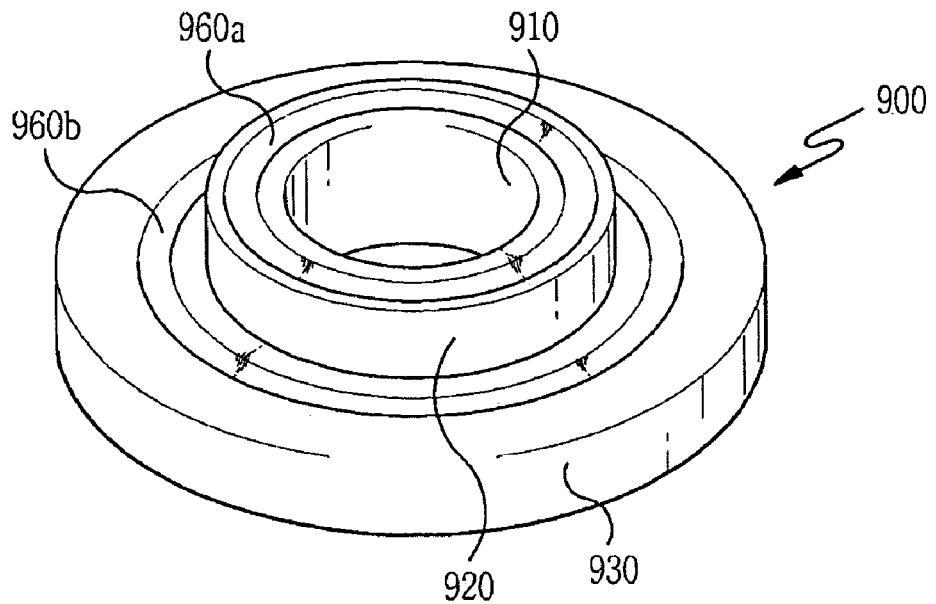
FIG. 12 is a perspective view of a sealing-member attaching part according to the present invention.
Figure 13:
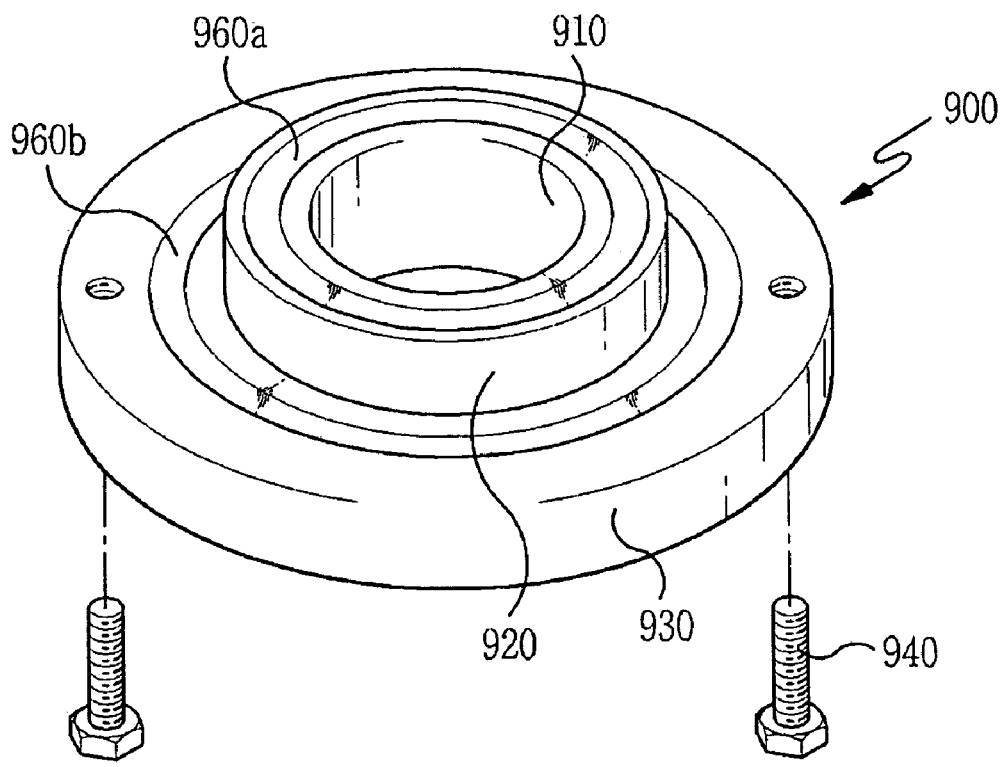
FIG. 13 is a perspective view of a structure of a sealing-member attaching part having bolts as fastening means.

As shown in FIG. 12, a through-hole 910 is provided at the center of the sealing-member attaching part 900, so that the robot shaft 510 can pass though the through-hole 910. In addition, the sealing-member attaching part 900 comprises an upper cylindrical portion 920 having a small diameter and a lower cylindrical portion 930 having a large diameter. The sealing-member attaching part 900 is fastened to the transfer chamber 800 by using fastening means 940 and 950. Preferably, the fastening means 940 is a bolt.

Figure 14:
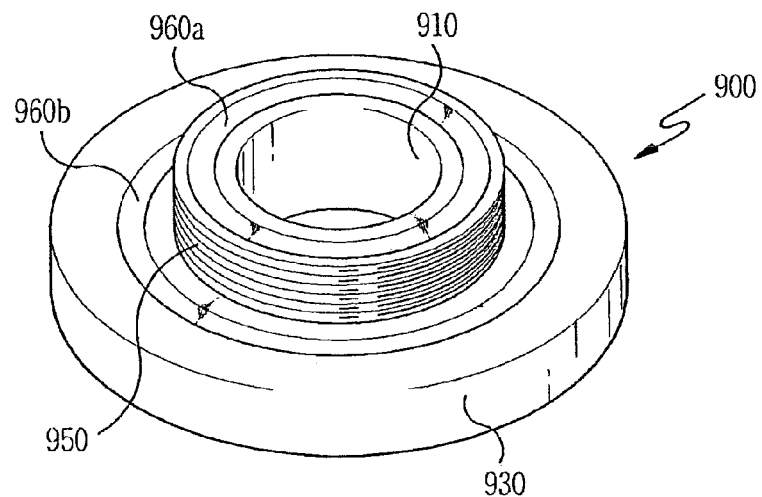
FIG. 14 is a perspective view of a structure of a sealing-member attaching part having a helical thread as fastening means.

Alternatively, as shown in FIG. 14, the fastening means 950 may be implemented by forming a helical thread on the outer surface of the upper cylinder 920 and fastening the helical thread to a helical thread formed on the inner surface of the robot shaft through-hole 600.

Preferably, the sealing members 700 shown in FIG. 11 are O-rings. The sealing members 700 are attached into the sealing-member attaching positions 960a and 960b formed on the sealing-member attaching part 900.

In a case where the sealing members 700a and 700b are provided to the transfer chamber 800 by using the sealing-member attaching part 900, the sealing-member attaching part 900 can be simply detached from the transfer chamber 800 by removing only the fastening means 940 and 950, so that it is possible to exchange the sealing members 700.

Now, preferred embodiments of substrate-position adjusting members provided at predetermined portions of the aforementioned transfer chamber will be described.

The transfer chamber according to the present invention comprises first substrate-position adjusting members for adjusting the x-directional movement of a substrate and second substrate-position adjusting members for adjusting the y-directional movement of the substrate.

Now, predetermined embodiments of the substrate-position adjusting members installed in the transfer chamber for the flat display device manufacturing apparatus will be described in detail with reference to the accompanying drawings. By the preferred embodiments, the constructions and functions of the present invention can be more clearly understood.

Figure 15:
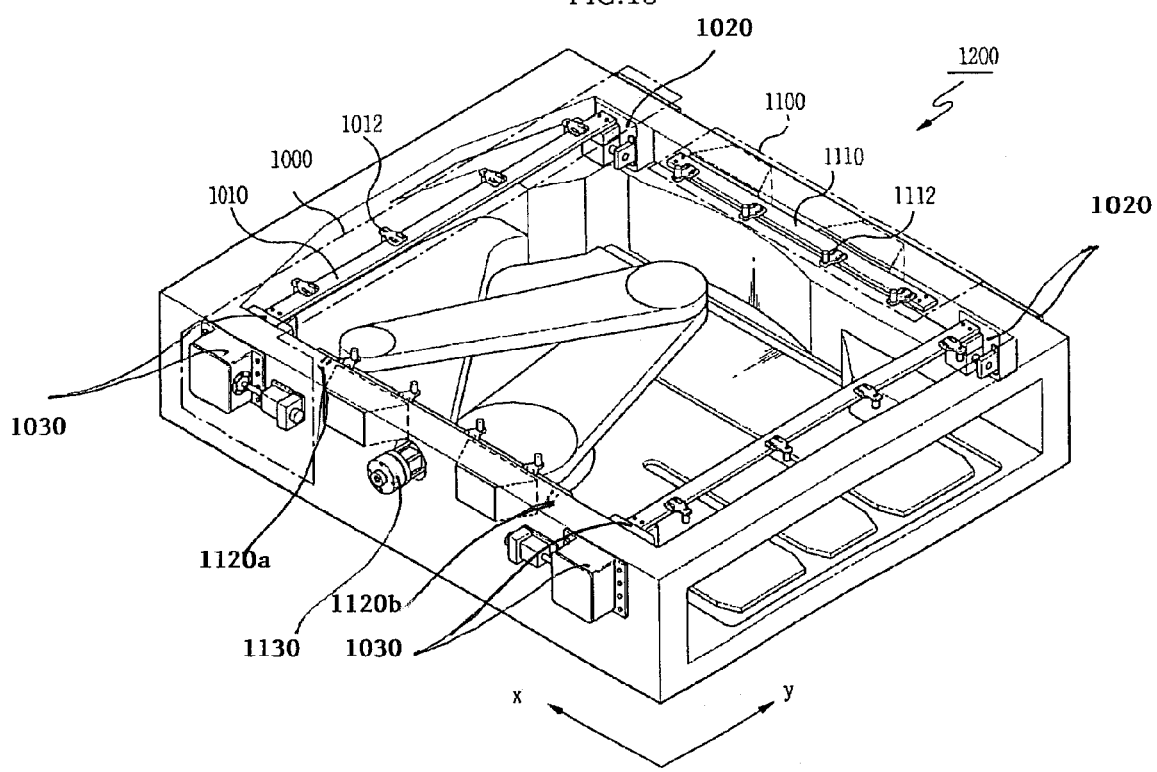
FIG. 15 is a perspective view of the transfer chamber according to the present invention in which substrate-position adjusting members are provided.

As shown in FIG. 15, the transfer chamber 1200 according to the present invention comprises two first substrate-position adjusting members 1000 for adjusting the x-directional movement of a substrate and two second substrate-position adjusting members 1100 for adjusting the y-directional movement of the substrate.

Figure 16:
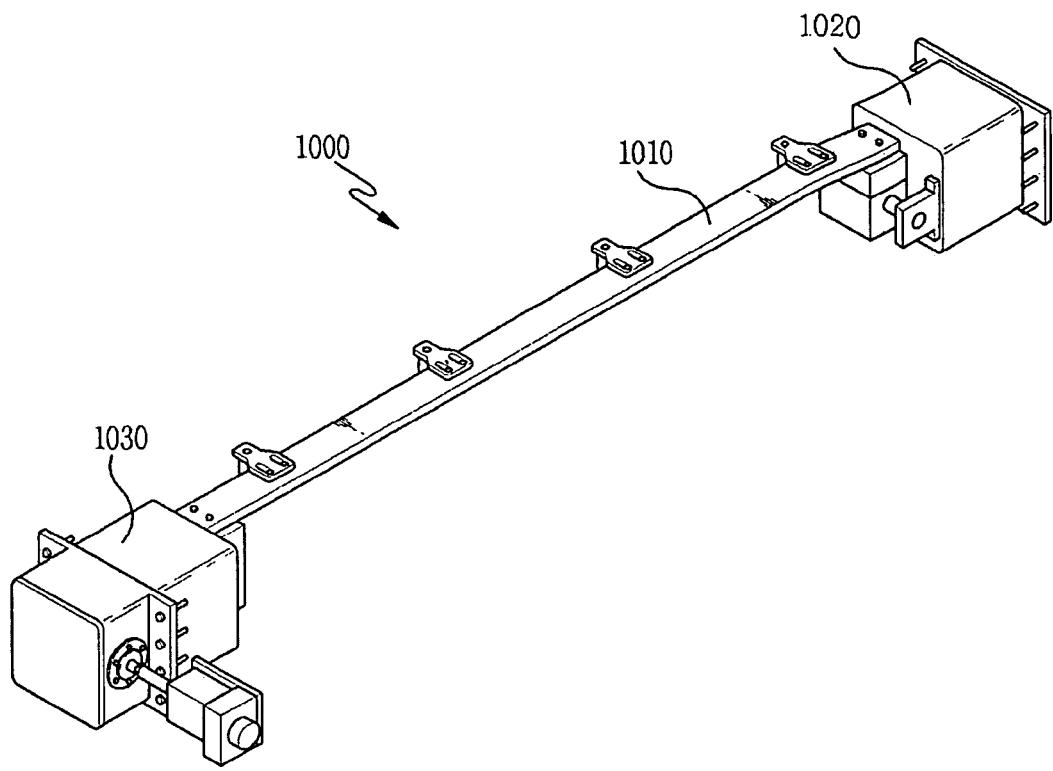
FIG. 16 is a perspective view of a structure of a first substrate-position adjusting member.

As shown in FIG. 16, each of the first substrate-position adjusting members 1000 comprises a first substrate contacting member 1010, a first supporting member 1020, and a first driving unit 1030.

Figure 17:
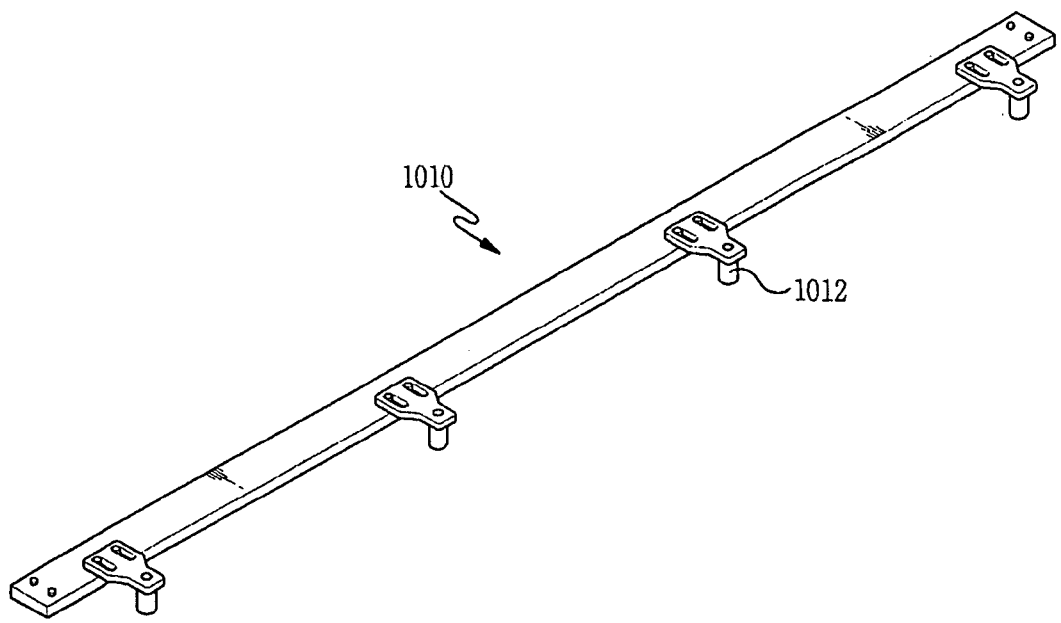
FIG. 17 is a perspective view of a structure of a first substrate contacting member.
Figure 18:
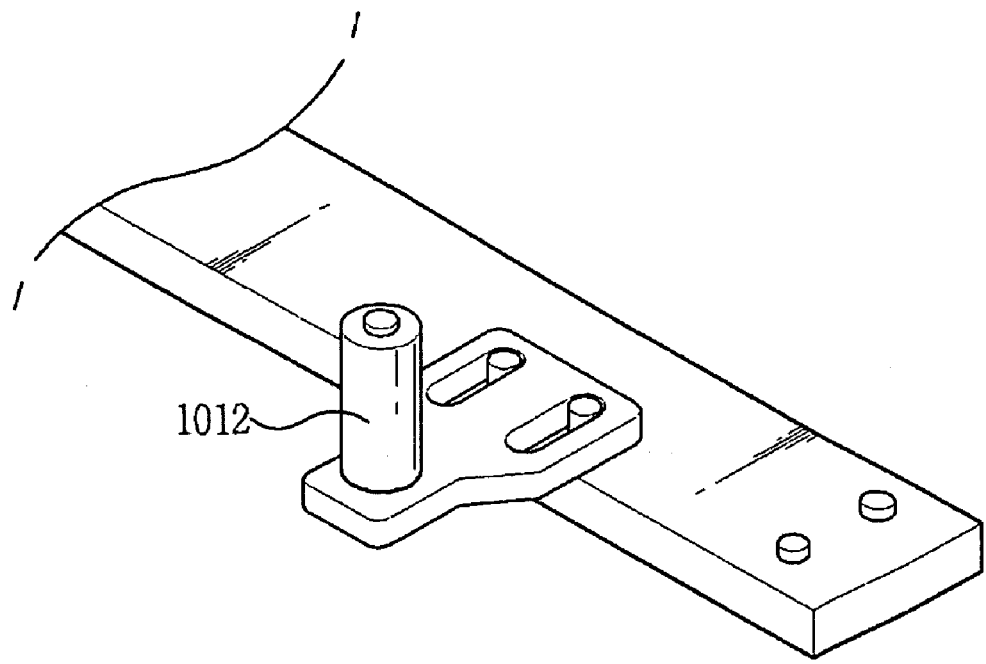
FIG. 18 is a perspective view of a structure of a first contacting piece.

The two first substrate contacting members 1010 provided at the both sides of the transfer chamber 1200 have a shape of a long bar to cross over the both side of the transfer chamber 1200. As shown in FIG. 17, a plurality of first contacting pieces 1012 are provided in a predetermined interval on the first substrate contacting member 1010. As shown in FIG. 18, each of the first contacting pieces 1012 can pivotally rotate around its own axis. Therefore, first contacting pieces 1012 are in contact with circumferential portion of the substrate (not shown) to move the substrate. Preferably, the first contacting pieces 1012 are made of an engineering plastic material such as TEFLON.

Figure 19:
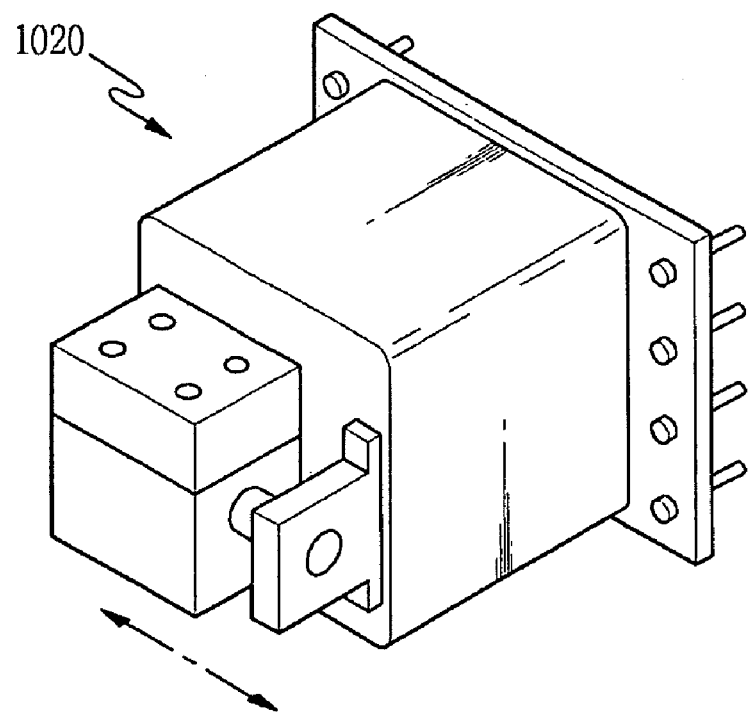
FIG. 19 is a perspective view of a structure of a first supporting member.

As shown in FIG. 16, one end portion of the first substrate contacting member 1010 is connected to the first supporting member 1020. As shown in FIG. 19, the first supporting member 1020 has a structure of horizontally sliding the first substrate contacting member 1010 in the x direction. The first contacting pieces 1012 are provided to pass through a wall of the transfer chamber 1200, so that the first substrate contacting member 1010 connected to the first supporting member 1020 can horizontally slide in the x direction.

Figure 20:
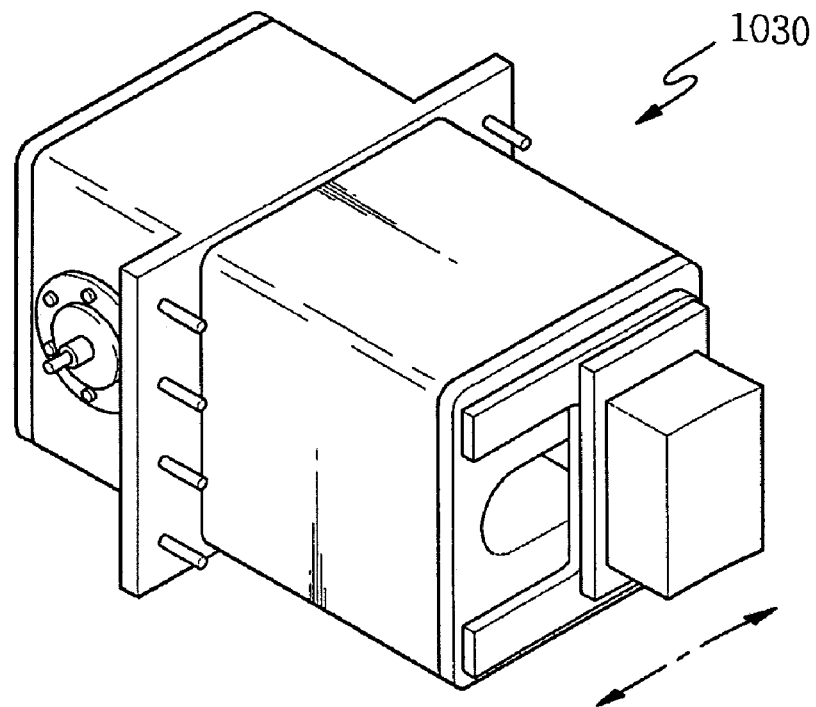
FIG. 20 is a perspective view of a structure of a first driving unit.

The other end portion of the first substrate contacting member 1010 is connected to the first driving unit 1030. As shown in FIG. 20, the first driving unit 1030 has a structure of horizontally moving the first substrate contacting member 1010 in the x direction. In addition, the first driving unit 1030 is provided to pass through the wall of the transfer chamber 1200.

Figure 21:
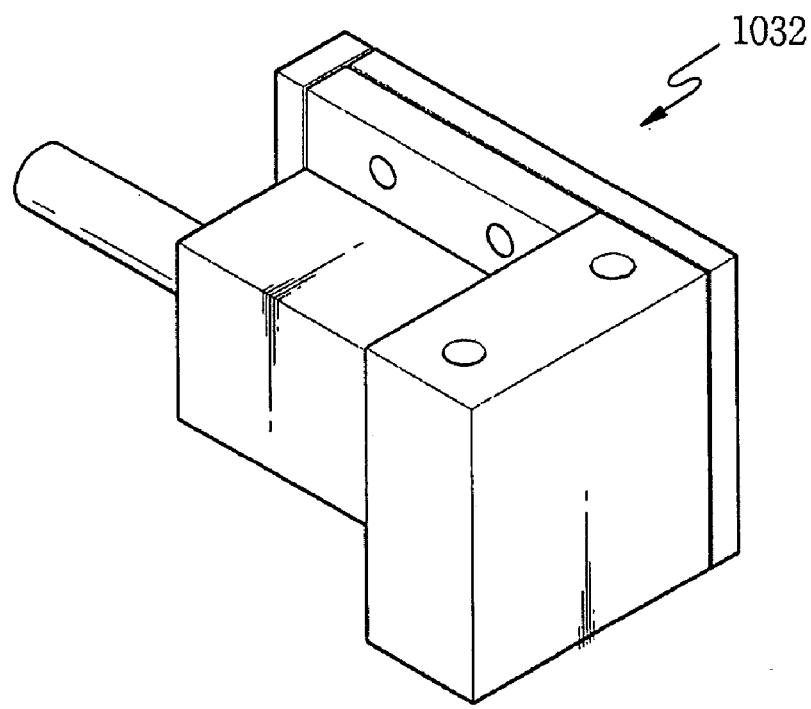
FIG. 21 is a perspective view of a structure of a first driving member.
Figure 22:
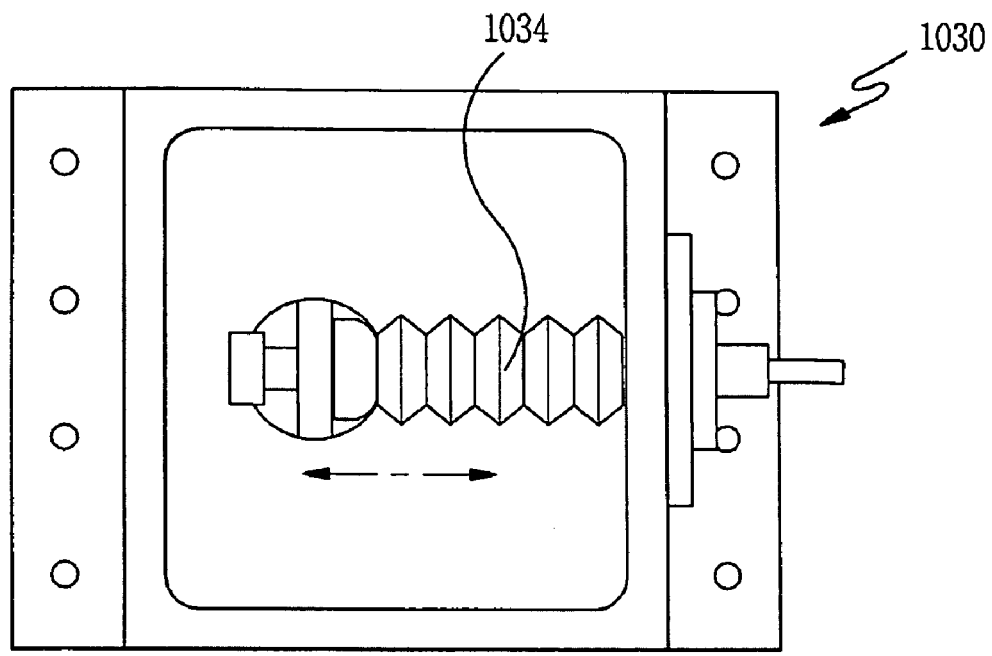
FIG. 22 is a cross sectional view of a connectional structure of the first driving member and the first substrate contacting member.
Figure 23:
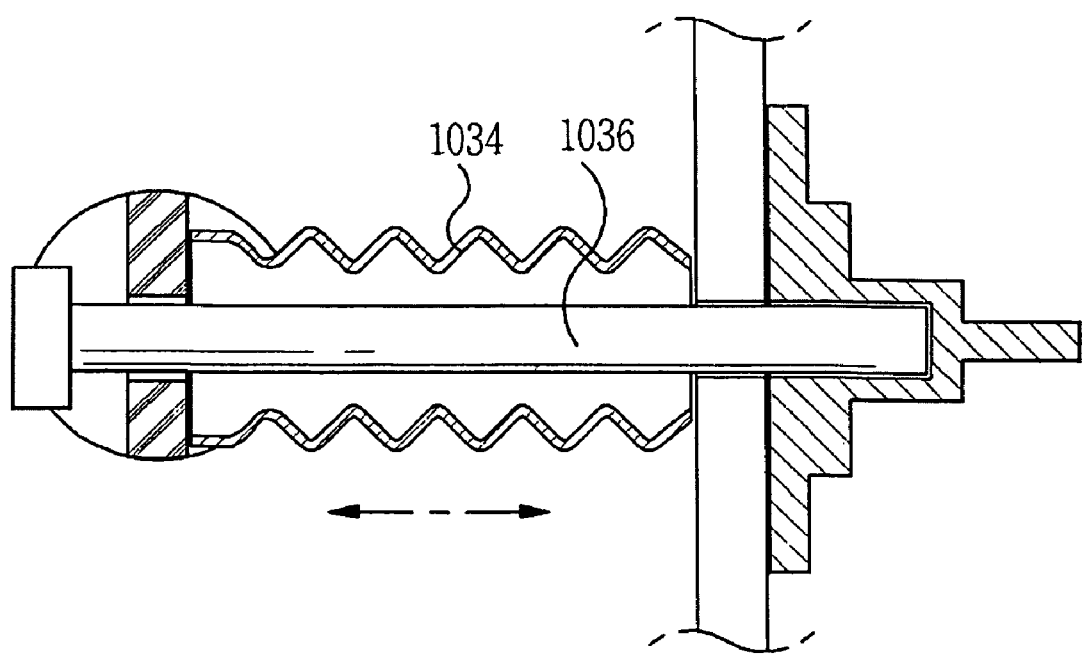
FIG. 23 is a cross sectional view of an internal structure of the first bellows module.

As shown in FIG. 21, the first driving unit 1030 further comprises a first driving member 1032 for driving the first substrate contacting member 1010. Preferably, the first driving member 1032 is a motor. As shown in FIG. 22, the first driving member 1032 is connected to the first substrate contacting member 1010 via a first bellow module 1034. The first bellow module 1034 has a function of horizontally moving the first substrate contacting member 1010 in the x direction while the interval portion of the transfer chamber 1200 where the first substrate contacting member 1010 is installed and the internal portion of the transfer chamber 1200 where the first driving member 1032 is installed are maintained in atmospheric and vacuum ambiences, respectively. Namely, as shown in FIG. 23, since the driving shaft 1036 connected to the first driving member 1032 are surrounded by the expansible bellow module 1034, it is possible to maintain the vacuum ambience even in case of the driving shaft 1036 moving.

Figure 24:
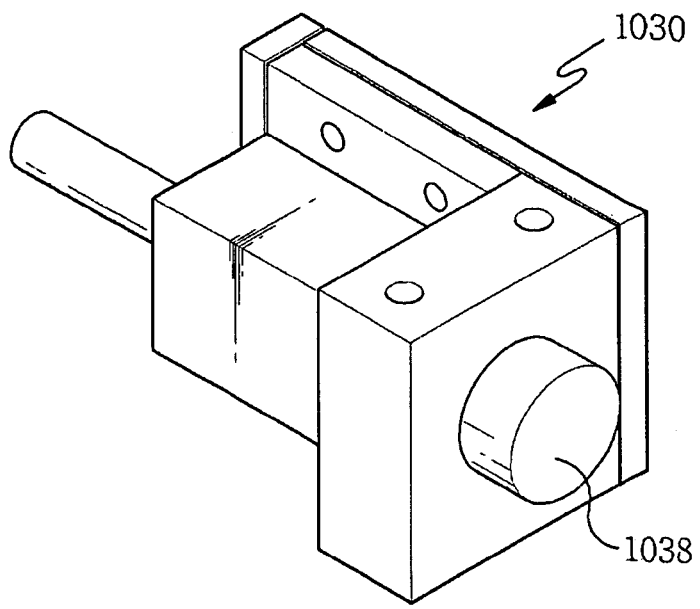
FIG. 24 is a perspective view of a first-substrate-contacting-member control knob provided to the first driving member.

Preferably, as shown in FIG. 24, the first driving member 1032 further comprises a first-substrate-contacting-member control knob 1038. By using the first-substrate-contacting-member control knob 1038, the first contacting pieces 1012 can be manually moved up to a vicinity of the substrate before the first contacting pieces 1012 are in contact with the substrate.

Figure 25:
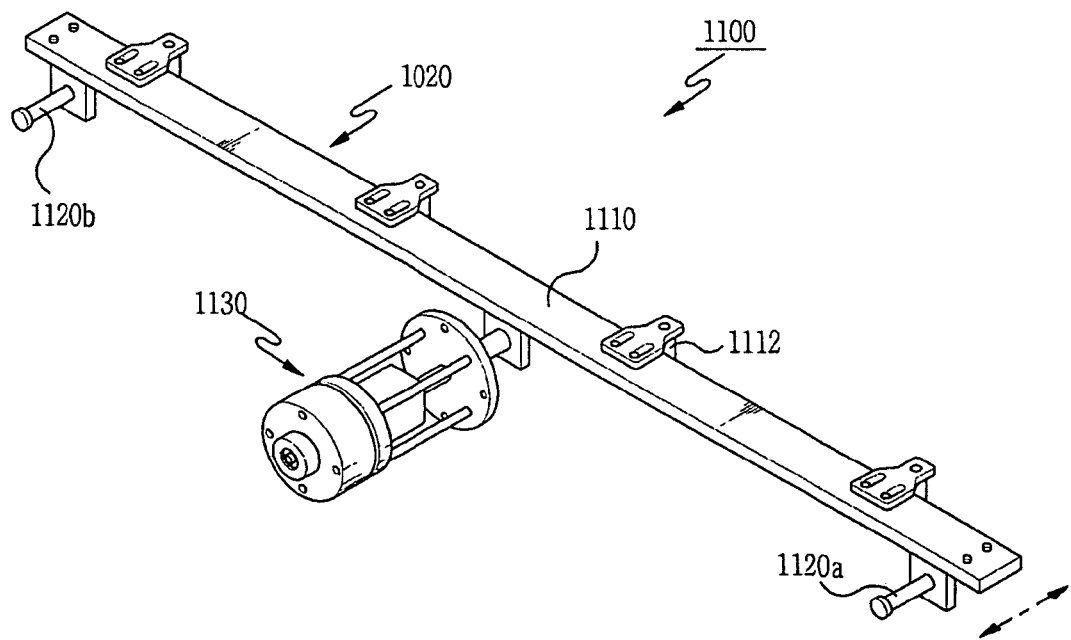
FIG. 25 is a perspective view of a structure of a second substrate-position adjusting member.

As shown in FIG. 25, each of the two second substrate-position adjusting members 1100 comprises a second substrate contacting member 1110, two second supporting members 1120, and a second driving unit 1130.

The detailed components of the second substrate-position adjusting member 1100 are the same as the first substrate-position adjusting members 1000. But, structures and functions of the detailed components of the second substrate-position adjusting member 1100 are different from the first substrate-position adjusting members 1000. Now, the different structures and functions will be described.

The two second substrate-position adjusting members 1100 are provided at the both sides of the transfer chamber 1200 where the first substrate-position adjusting members 1000 are not provided.

As shown in FIG. 17, similarly to the first substrate contacting member 1010, the second substrate contacting member 1110 has a shape of a long bar, and a plurality of second contacting pieces 1112 are provided in a predetermined interval on the second substrate contacting member 1110. Preferably, as shown in FIG. 15, the first contacting pieces 1012 are provided on the upper surface of the first substrate contacting member 1010 and the second contacting pieces 1112 are provided on the lower surface of the second substrate contacting member 1110. As a result, it is possible not to overlap the installation positions of the components installed outside of the transfer chamber 1200 such as the first and second driving members 1032 and 1132 of the first and second substrate-position adjusting members 1000 and 1100. In addition, it is possible not to overlap the movement radii of the first and second substrate contacting members 1010 and 1110.

The structure and material of the second contacting pieces 1112 are the same as the first contacting pieces 1012.

The second supporting members 1120a and 1120b are connected to the respective end portions of the second substrate contacting member 1110. The second supporting members 1120 connected to the end portions of the second substrate contacting member 1110 support to the second substrate contacting member 1110. The second supporting members 1120a and 1120b are provided to pass through the wall of the transfer chamber 1200, so that the second substrate contacting member 1110 can horizontally slide in the y direction.

Figure 26:
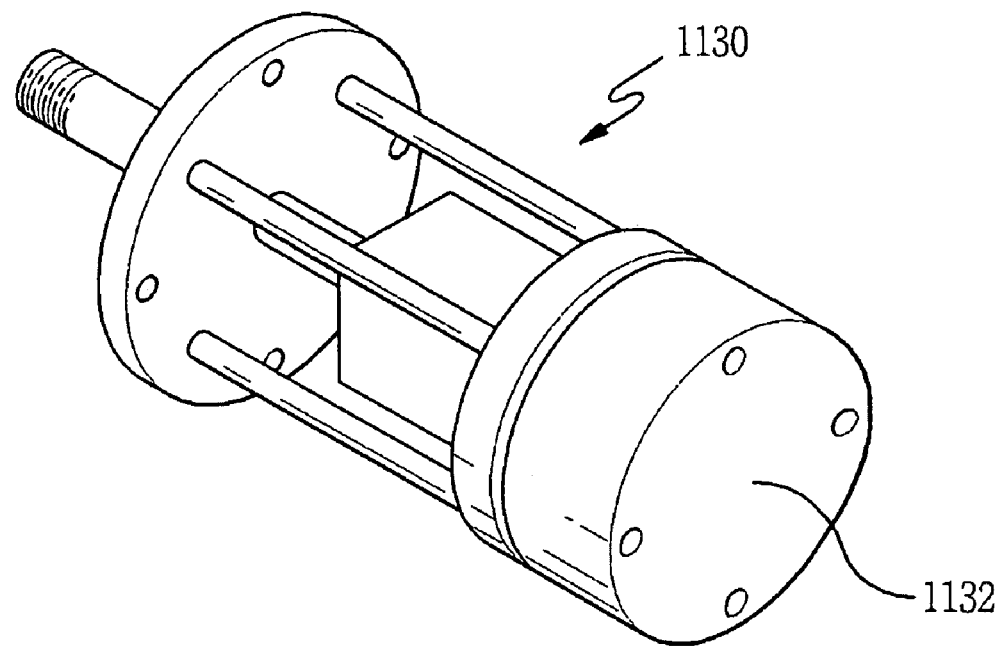
FIG. 26 is a perspective view of a structure of a second driving unit.

As shown in FIG. 25, the second driving unit 1130 is connected to the central portion of the second substrate contacting member 1110. The second driving unit 1130 is provided to pass through the wall of the transfer chamber 1200, so that the second substrate contacting member 1110 can horizontally slide in the y direction. As shown in FIG. 26, the second driving unit 1130 further comprises a second driving member 1132 used to slide the second substrate contacting member 1110. The second driving member 1132 provided outside of the transfer chamber is connected to the second driving unit 1130. The second driving member 1132 is connected to the second substrate contacting member 1110 via a second bellows module (not shown), so that it is possible to drive the second substrate contacting member 1110 while maintaining the vacuum ambience of the internal portion of the transfer chamber 1200.

Figure 27:
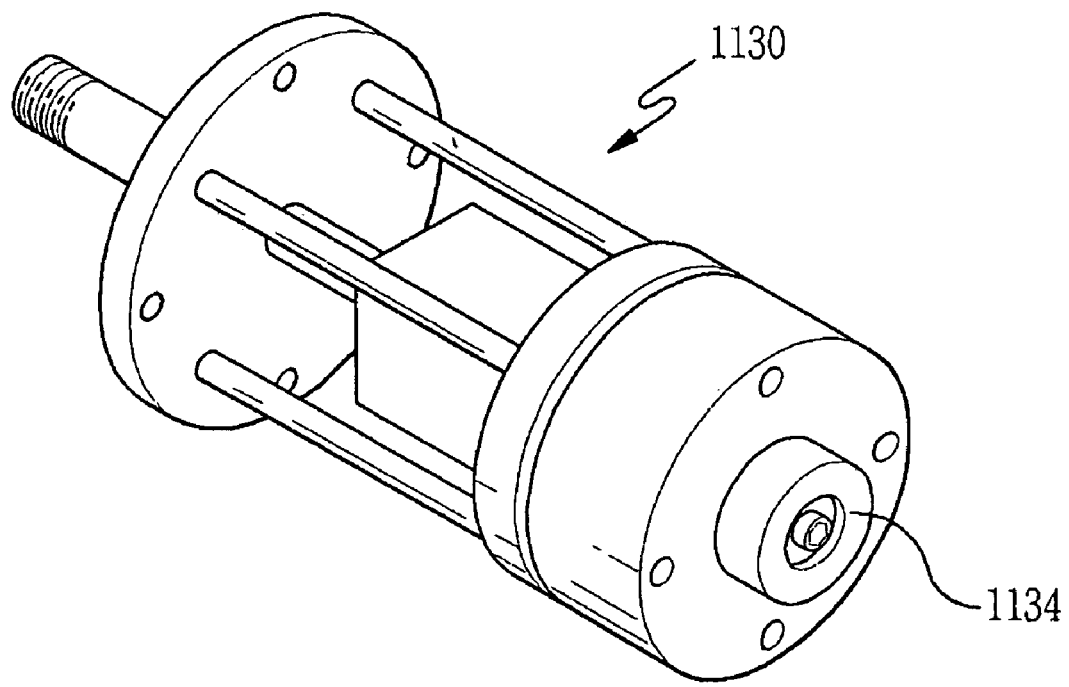
FIG. 27 is a perspective view of a second-substrate-contacting-member control knob provided to a second driving member.

Preferably, as shown in FIG. 27, the second driving unit 1030 further comprises a second-substrate-contacting-member control knob 1134. Similarly to the first-substrate-contacting-member control knob 1138, by using the second-substrate-contacting-member control knob 1134, the second contacting pieces 1112 can be manually moved up to a vicinity of the substrate before the second contacting pieces 1112 are in contact with the substrate.

While the present invention has been particularly shown and described with reference to exemplary embodiments thereof, it will be understood by those skilled in the art that various changes in form and details may be made there in without departing from the spirit and scope of the present invention as defined by the appended claims.

What is claimed is:

1. A transfer chamber for a flat display device manufacturing apparatus, the transfer chamber comprising:
   a pair of first substrate-position adjusting members respectively provided at first and second sides of the transfer chamber, wherein each of the pair of first substrate-position adjusting members comprises:
      a first substrate contacting member that extends along a respective side of the transfer chamber;
      a first supporting member connected to a first end portion of the first substrate contacting member; and
      a first driving unit connected to a second end portion of the first substrate contacting member opposite the first end portion;
   a pair of second substrate position-adjusting members respectively provided at third and fourth sides of the transfer chamber, the first and second sides of the transfer chamber being opposite each other and the third and fourth sides of the transfer chamber being opposite each other, wherein the pair of first substrate-position adjusting members and the pair of second substrate-position adjusting members are configured to receive a substrate thereon so as to adjust an x-directional and a y-directional movement of the substrate, respectively; and
   a plurality of first contacting pieces provided at predetermined intervals on the first substrate contacting member.

2. The transfer chamber of claim 1, wherein the first supporting member extends through a corresponding wall of the transfer chamber, and wherein the first supporting member is configured to slide the first substrate contacting member.

3. The transfer chamber of claim 1, wherein the first driving unit extends through the wall of the transfer chamber, and wherein the first driving unit is configured to move the first substrate contacting member.

4. The transfer chamber of claim 1, wherein the first driving unit further comprises a first driving member that drives the first substrate contacting member.

5. The transfer chamber of claim 3, further comprising a first bellows module that connects the first driving member to the first substrate contacting member.

6. The transfer chamber of claim 5, wherein each of the plurality of first contacting pieces pivotally rotates about its own axis.

7. The transfer chamber of claim 5, wherein the plurality of first contacting pieces are made of an engineered plastic material.

8. The transfer chamber of claim 1, wherein the first driving member further comprises a first-substrate-contacting-member control member.

9. The transfer chamber of claim 8, wherein the pair of second supporting members extend into a corresponding wall of the transfer chamber, and wherein the second supporting members are configured to horizontally slide the second substrate contacting member in a y direction.

10. The transfer chamber of claim 8, wherein the second driving unit extends through a corresponding wall of the transfer chamber, and wherein the second driving unit is configured to move the second substrate contacting member.

11. The transfer chamber of claim 10, further comprising a second bellows module that connects the second driving member to the second substrate contacting member.

12. The transfer chamber of claim 11, wherein each of the plurality of second contacting pieces pivotally rotates about its own axis.

13. The transfer chamber of claim 11, wherein the plurality of second contacting pieces are made of an engineered plastic material.

14. The transfer chamber of claim 8, wherein the second driving unit further comprises a second driving member that drives the second substrate contacting member.

15. The transfer chamber of claim 8, further comprising a plurality of second contacting pieces provided at predetermined intervals on the second substrate contacting member.

16. The transfer chamber of claim 8, wherein the second driving member further comprises a second-substrate-contacting-member control member.

17. The transfer chamber of claim 1, wherein each of the pair of second substrate-position adjusting members comprises:
    a second substrate contacting member;
    a pair of second supporting members respectively connected to opposite end portions of the second substrate contacting member; and
    a second driving unit connected to a central portion of the second substrate contacting member.

* * * * *